(12) United States Patent
Burns

(10) Patent No.: US 6,567,021 B1
(45) Date of Patent: May 20, 2003

(54) DESIGN-FOR-TEST CIRCUIT FOR SUCCESSIVE APPROXIMATION ANALOG-TO-DIGITAL CONVERTERS

(75) Inventor: Mark A. Burns, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/642,517

(22) Filed: Aug. 18, 2000

(51) Int. Cl.$^7$ ................................................ H03M 1/10
(52) U.S. Cl. ...................................... 341/120; 341/163
(58) Field of Search ................................ 341/155, 163, 341/165, 120

(56) References Cited

U.S. PATENT DOCUMENTS

| | | | | |
|---|---|---|---|---|
| 4,775,852 A | * | 10/1988 | Sloane | 341/118 |
| 5,006,852 A | * | 4/1991 | Goto et al. | 341/155 |
| 5,252,976 A | * | 10/1993 | Miho et al. | 341/163 |
| 5,578,935 A | * | 11/1996 | Burns | 324/763 |
| 6,211,803 B1 | * | 4/2001 | Sunter | 341/120 |
| 6,243,034 B1 | * | 6/2001 | Regier | 341/166 |
| 6,268,972 B1 | * | 7/2001 | Philpott et al. | 360/46 |
| 6,329,938 B1 | * | 12/2001 | Spaur et al. | 341/118 |
| 6,351,231 B1 | * | 2/2002 | Price et al. | 341/155 |

* cited by examiner

*Primary Examiner*—Peguy Jeanpierre
(74) *Attorney, Agent, or Firm*—J. Dennis Moore; W. James Brady, III; Frederick J. Telecky, Jr.

(57) ABSTRACT

The present invention provides a method (30) of testing analog-to-digital converters (ADCs) (12) that shortens the test time required to measure INL and DNL by advantageously converting the ADC (12) into a digital to analog converter (DAC) (10). The conversion from ADC to DAC is accomplished using a DfT test mode, which reconfigures the ADC into a DAC using a delta modulation circuit. Since DACs can be tested much more efficiently than ADCs, the ADC test time is substantially reduced by the invention.

21 Claims, 2 Drawing Sheets

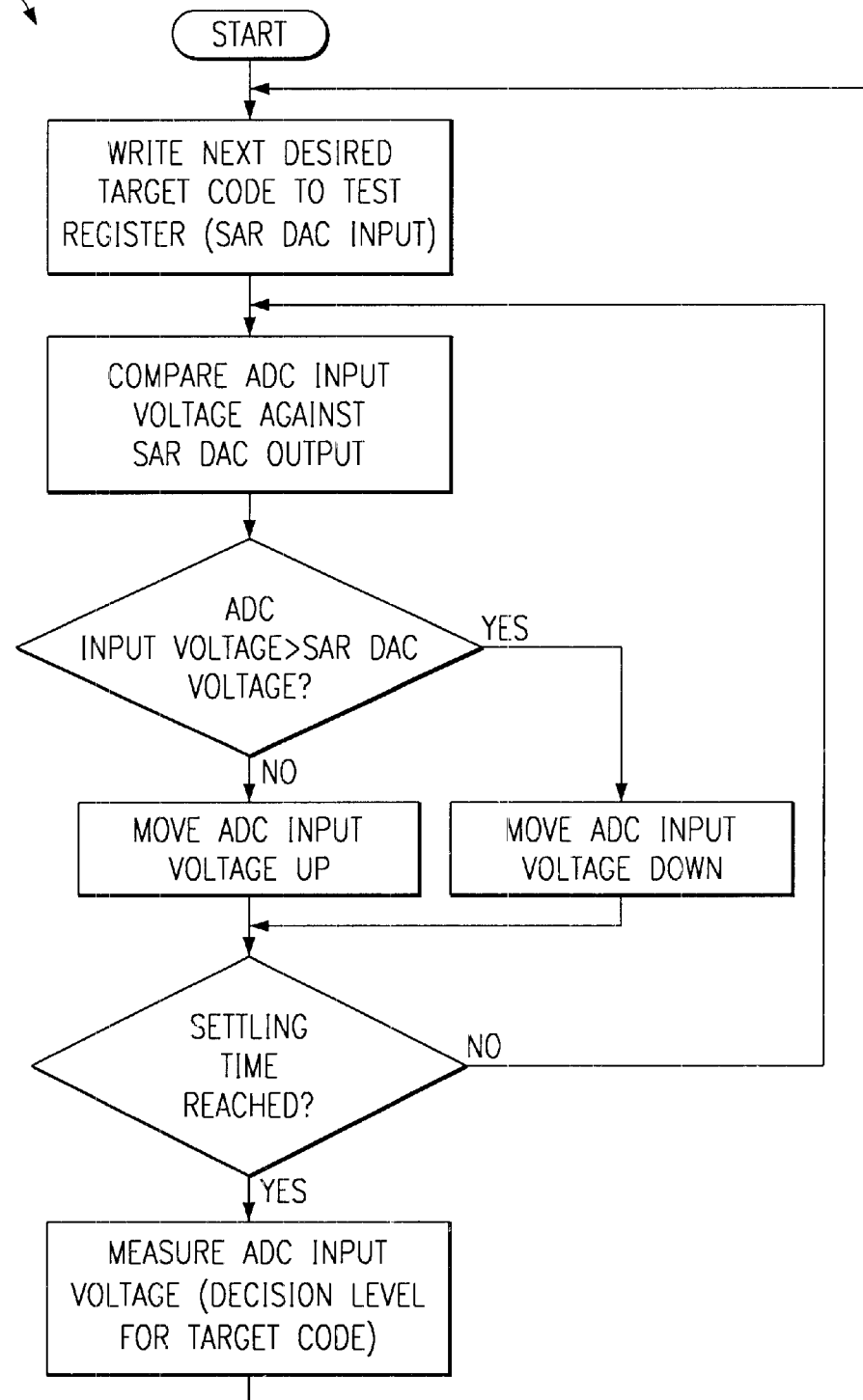

DESIGN-FOR-TEST CIRCUIT FOR SUCCESSIVE APPROXIMATION ANALOG-TO-DIGITAL CONVERTERS

FIELD OF THE INVENTION

This invention relates generally to the field of electronic design and test, and specifically to the field of mixed-signal IC design for test (DfT).

BACKGROUND OF THE INVENTION

Two important performance measurements for analog to digital converters (ADCs) are integral non-linearity (INL) and differential non-linearity (DNL). These test are very time consuming, and lead to very high production testing costs. In prior art test methodologies, successive approximation analog-to-digital converters (ADCs) have been tested using a histogram approach to measure integral non-linearity (INL) and differential nonlinearity (DNL). The input to the ADC can be either a voltage ramp, voltage triangle (up ramp/down ramp) or a sine wave. Both the ramp and sine wave histogram techniques are documented in Chapters 11 and 12 of the book "An Introduction to Mixed-Signal IC Test and Measurement" by Mark Burns. The objective of either test approach is to measure the range of input voltages that produce each of the possible digital outputs from the ADC. The voltage levels that correspond to the transitions from one code to the next are called decision levels. The voltage ranges corresponding to each ADC code are referred to as step sizes.

If the step sizes for each code are not substantially equal to one another, the converter is said to be non-linear. Integral nonlinearity is the measurement of the maximum positive deviation and maximum negative deviation of the actual decision levels from the ideal decision levels. Differential nonlinearity is the measurement of the difference between one step size and the next, relative to the average step size across all ADC codes. Measurement of INL and DNL therefore requires that one knows the ADC input voltage corresponding to each decision level.

The measurement of ADC INL and DNL is very time consuming, driving up the cost of production testing of mixed-signal devices containing ADCs. Every additional bit of ADC converter resolution doubles the time it takes to measure INL and DNL.

Using either the ramp or sine wave histogram test approach, it is necessary to apply an input voltage that slowly progresses past each decision level, producing, on average, at least 16 occurrences, or "hits", of each output code. So, for example, a 12-bit ADC requires at least 16×2^12 full analog-to-digital conversion cycles. The number of hits for each code should ideally be equal, since each step size is ideally equal to all the other step sizes. However, wider codes will produce more hits, while narrow codes will produce fewer hits. The average number of hits per code therefore represents the average step size, or least significant bit (LSB). The histogram is a plot of the number of hits for each code plotted as a function of the code number. Variations in the histogram hit counts are therefore a direct measurement of the non-uniformity of the individual step sizes.

An alternative prior-art technique is to use an external servo circuit, which adjusts the ADC input voltage up or down until a desired output code is achieved as shown in FIG. 1. This test methodology is also slow, since the servo process takes many full ADC conversion cycles to converge to each decision level.

SUMMARY OF THE INVENTION

The present invention reduces the time required to measure the INL and DNL performance of ADCs by shortening the successive approximation algorithm of the ADC. The invention advantageously comprises a method that reconfigures an ADC under test into a DAC. However, instead of performing a full conversion and comparing the final digital output with a desired output code, the desired target code is written directly to an ADC SAR register or to a dedicated test mode register. Advantageously, using the test mode of the present invention, the ADC does not perform a successive approximation conversion. Instead, the SAR control logic simply writes the desired code to a successive approximation DAC which forms a part of the ADC. A comparator compares the input voltage against the SAR DAC voltage. A servo integrator is then ramped up or down by the SAR logic, depending on the comparison result. Therefore, the ADC can make a single quick comparison to determine which direction the servo integrator should ramp. This is a much faster process than the prior art servo technique which requires a full ADC successive approximation conversion cycle before the ramp-up/ramp-down decision can be made.

BRIEF DESCRIPTION OF THE DRAWINGS

FIG. 3 is a flow diagram of the methodology of the present invention.

DETAIL DESCRIPTION OF THE PREFERRED EMBODIMENT

Figure 2:
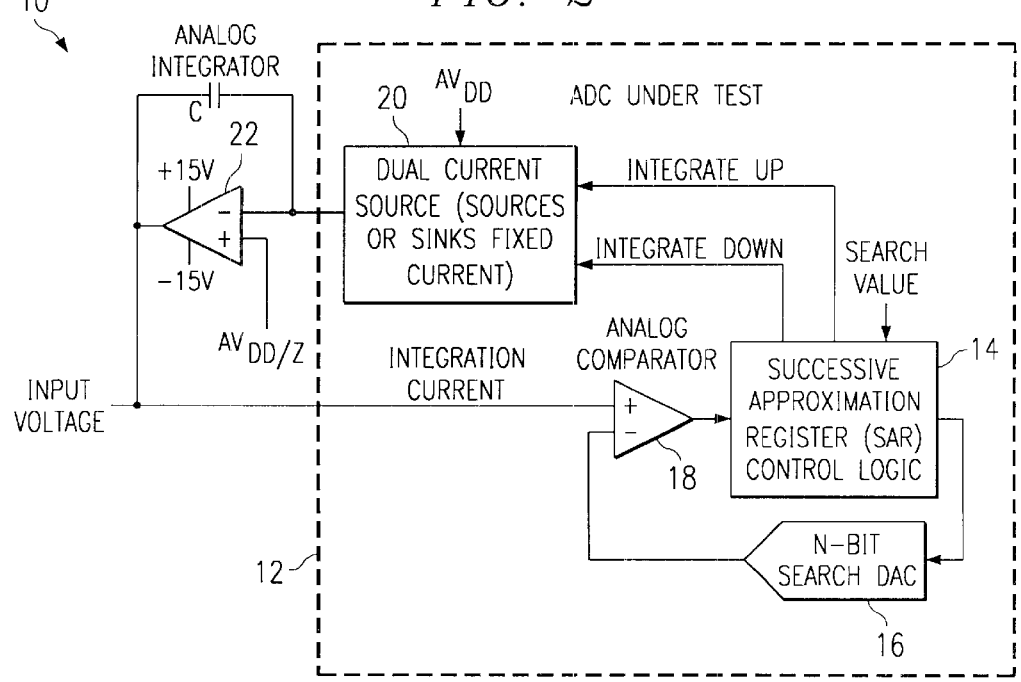
FIG. 2 is a block diagram of the methodology of the present invention implementing a DAC to form a delta modulator.

The invention advantageously comprises a method 10 that reconfigures an ADC 12 under test into a DAC, forming the servo circuit shown at 10 in FIG. 2. However, instead of performing a full conversion and comparing the final digital output with a desired output code, the desired code is written directly to an ADC SAR register 14 or to a dedicated test mode register. Advantageously, using the test mode 10 of the present invention, the ADC 12 does not perform a successive approximation conversion. Instead, the SAR control logic 14 simply writes the desired code to a successive approximation DAC 16 which forms a part of the ADC 12. Comparator 18 compares the input voltage against the SAR DAC 16 voltage. A servo integrator 20 is then ramped up or down by the SAR logic 14, depending on the comparison result from comparator 18. Therefore, the ADC 12 can make a single quick comparison to determine which direction the servo integrator 20 should ramp. This is a much faster process than the prior art servo technique which requires a full ADC conversion cycle before the ramp-up/ramp-down decision can be made.

The present invention overcomes the inefficiency of the prior art where the ADC has no way to know that the input signal has not changed very much from the previous conversion cycle. The prior art ADC therefore starts from a reset state each time, performing a full successive approximation cycle which wastes many clock cycles and adds significant test time.

In the test mode of the present invention, the digital value written into the ADC test register can be thought of as a DAC digital input code. In the test mode, the integrator 20, SAR logic 14, and ADC comparator 18 form a delta modulator, whose output (after low-pass filtration) represents the DAC's output voltage. As each code is written to the DAC 16, the output converges to a voltage level that is substantially equal to the ADC decision level at that code. Therefore, the ADC is converted into an equivalent DAC.

The novel aspect of the current invention is that the ADC's normal SAR process is replaced by an immediate comparison between the input voltage and the SAR DAC 16 voltage corresponding to the desired digital output level using comparator 18.

The integrator 20 may be implemented using a pair of current sources that source or sink current to or from an external analog integrator comprising an OP Amp 22 and a Capacitor C. This particular analog integrator advantageously can ramp rail-to-rail. Thus, the integrator 20 can be implemented with very few circuit components, a desirable feature in DfT circuits. The linearity of the integrator 20 is unimportant, since an external voltmeter or digitizer measures the ADC input voltage corresponding to each ADC decision level. If the integrator 20 is non-linear, it will still converge to the voltage corresponding to the desired decision level. Only the linearity of the external instrument is important.

Figure 1:
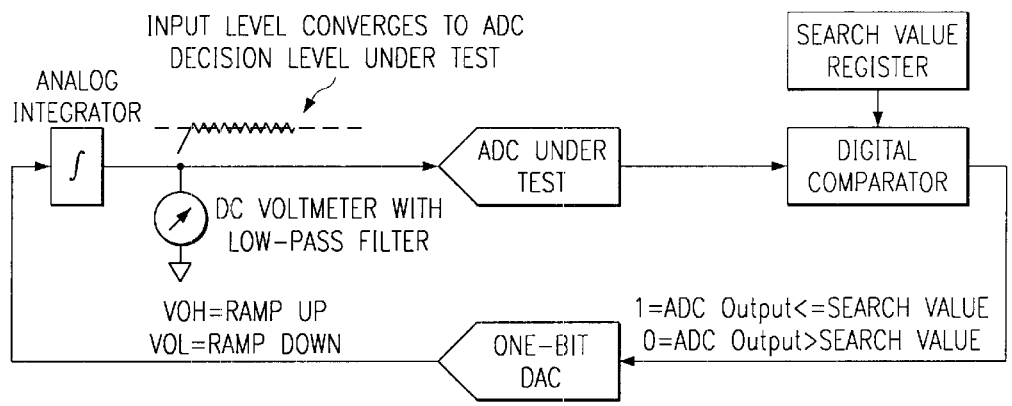
FIG. 1 is a block diagram of a conventional test methodology of an ADC using successive approximation.

It should be noted that portions of this circuit 10 may be moved on or off chip without affecting the scope of this invention. FIG. 2 is merely one preferred configuration. The invention encompasses the use of a more efficient comparison process that bypasses the normal SAR/digital comparison process of FIG. 1, and replaces it with a single comparison against a desired search value. The desired search value is written directly to the SAR DAC 16, bypassing the inefficient SAR process.

It should also be noted that many successive approximation ADC architectures contemplated and are covered by the present invention that may not correspond to the simple ADC shown in FIG. 2. Each of these architectures can be tested using a similar delta-modulation approach that eliminates all or part of the time-consuming SAR process from the servo process. Also, the servo process may be accomplished using a delta modulation process (ramp up/ramp down) or it may be achieved using a more sophisticated binary search methodology (i.e. by using a DAC instead of a simple integrator).

FIG. 3 depicts at 30 a flow diagram of the present invention described with reference to FIG. 2. This algorithm derives the technical advantages described, and is one preferred algorithm, although the present invention includes other equivalent methodologies without departing from the scope of the present invention.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

I claim:

1. An analog-to-digital converter (ADC) circuit, comprising:
   an integrator coupled to an input of the ADC circuit;
   a comparator having a first and second input and an output, said first input coupled to said ADC circuit input;
   a successive approximation register (SAR) control logic controlling said integrator; and
   a digital-to-analog convertor (DAC) responsively coupled to said SAR control logic and having an output coupled to said comparator second input.

2. The ADC circuit as specified in claim 1 wherein said integrator is adapted to integrate an input signal provided to the ADC input both up and down.

3. The ADC circuit as specified in claim 2 wherein said SAR control logic controls the direction of said integration by said integrator.

4. The ADC circuit as specified in claim 1 wherein said integrator, said SAR control logic and said comparator form a delta modulator having an output representing an output voltage of said DAC.

5. The ADC circuit as specified in claim 1 wherein said SAR control logic provides a code to said DAC as a function of a decision level, whereby said DAC provides an analog said output to said comparator that is substantially equal to said ADC decision level for said code.

6. The ADC circuit as specified in claim 5 wherein SAR control logic has an input for receiving a desired said code.

7. The ADC circuit as specified in claim 1 wherein said integrator is implemented using a pair of current sources that are adapted to source or sink current to or from, respectively, an external capacitor.

8. A method of testing an analog-to-digital convertor (ADC), comprising the steps of:
   providing an input voltage to an integrator;
   writing a desired code to a successive approximation register (SAR);
   performing a digital-to-analog (D/A) conversion to the SAR code to generate an output signal; and
   comparing the output signal to the input voltage;
   wherein the integrator ramps the input voltage as a function of the comparison.

9. The method as specified in claim 8 wherein the SAR controls ramping up or ramping down of the integrator.

10. The method as specified in claim 9 wherein the SAR controls the ramping as a function of the comparison of the output signal to the input voltage.

11. The method as specified in claim 9 wherein the SAR controls a direction of the ramping.

12. The method as specified in claim 10 wherein the desired code is a digital value.

13. A method of testing an analog-to-digital convertor (ADC), comprising the steps of:
   providing an input voltage to an integrator;
   writing a desired code to a successive approximation register (SAR);
   performing a digital-to-analog (D/A) conversion to the SAR code to generate an output signal, wherein the output signal of the D/A conversion is substantially equal to a decision level provided to the SAR; and
   comparing the output signal to the input voltage.

14. The method as specified in claim 13 wherein the SAR controls ramping up or ramping down of the integrator.

15. The method as specified in claim 14 wherein the SAR controls the ramping as a function of the comparison of the output signal to the input voltage.

16. The method as specified in claim 15 wherein the desired code is a digital value.

17. A method of testing an analog-to-digital convertor (ADC), comprising the steps of:
   providing an input voltage to an integrator;
   writing a desired code to a successive approximation register (SAR);
   performing a digital-to-analog (D/A) conversion to the SAR code to generate an output signal; and
   comparing the output signal to the input voltage;

wherein the integrator performs integration using a current source.

18. The method as specified in claim 17 wherein an capacitor external to the ADC is used for the current source.

19. An analog-to-digital convener (ADC) circuit, comprising:
   an integrator coupled to an input of the ADC circuit;
   a comparator having a first and second input and an output, said first input coupled to said ADC circuit input;
   a successive approximation register (SAR) control logic having an input coupled to the output of said comparator and controlling said integrator; and
   a digital-to-analog convertor (DAC) responsively coupled to said SAR control logic and having an output coupled to said comparator second input.

20. An analog-to-digital converter (ADC) circuit as in claim 19 wherein said integrator comprises a servo integrator controlled by said SAR control logic and an analog integrator having an input coupled to an output of said servo integrator and having an output coupled to said input of the ADC circuit.

21. A method of testing an analog-to-digital convertor (ADC), comprising the steps of:
   providing an input voltage to an integrator;
   writing a desired code to a successive approximation register (SAR);
   performing a digital-to-analog (D/A) conversion to the SAR code to generate an output signal; and
   comparing the output signal to the input voltage, wherein an analog comparator is used for the comparison, and wherein the integrator, SAR and comparator form a delta modulator.

* * * * *